United States Patent [19]
Koike

[11] Patent Number: 5,874,325
[45] Date of Patent: *Feb. 23, 1999

[54] METHOD OF MANUFACTURING SEMICONDUCTOR DEVICE WITH GETTERING AND ISOLATION

[75] Inventor: Hidetoshi Koike, Kawasaki, Japan

[73] Assignee: Kabushiki Kaisha Toshiba, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 734,204

[22] Filed: Oct. 21, 1996

[30] Foreign Application Priority Data

Oct. 25, 1995 [JP] Japan .................................. 7-276063

[51] Int. Cl.⁶ .................................................. H01L 21/335
[52] U.S. Cl. ......................... 438/143; 438/402; 438/439; 438/476
[58] Field of Search .................................. 438/476, 143, 438/402, 439

[56] References Cited

U.S. PATENT DOCUMENTS

| | | | |
|---|---|---|---|
| 3,913,211 | 10/1975 | Seeds et al. | 438/439 |
| 4,732,869 | 3/1988 | vanAttekum et al. | 438/476 |
| 4,766,086 | 8/1988 | Ohshima et al. | 438/402 |
| 4,931,405 | 6/1990 | Kamijo et al. | 437/12 |
| 5,138,421 | 8/1992 | Saito | 357/49 |
| 5,162,241 | 11/1992 | Mori et al. | 437/10 |
| 5,194,395 | 3/1993 | Wada | 438/402 |
| 5,444,001 | 8/1995 | Tokuyama | 438/402 |
| 5,445,975 | 8/1995 | Gardner et al. | 437/10 |

FOREIGN PATENT DOCUMENTS

| | | |
|---|---|---|
| 61-159741 | 7/1986 | Japan . |
| 2218136 | 8/1990 | Japan . |
| 5109736 | 4/1993 | Japan . |

*Primary Examiner*—John F. Niebling
*Assistant Examiner*—Lynne A. Gurley
*Attorney, Agent, or Firm*—Loeb & Loeb LLP

[57] ABSTRACT

The method of manufacturing a semiconductor device including the step of forming a silicon oxide film on an obverse surface and a reverse surface of a silicon substrate before formation of an element separation region on a semiconductor substrate. Further, the reverse surface of the silicon substrate is exposed by selectively removing only the silicon oxide film formed on the reverse surface of the silicon substrate. A silicon thin film is formed on each of the silicon oxide film and the exposed reverse surface of the silicon substrate, gettering occurring in the silicon thin film formed on the reverse surface of the silicon substrate. The first thin film is formed on each of the silicon thin films. An element separation resist is patterned on the first thin film on the obverse surface of the silicon substrate. The first thin film on the obverse surface of the silicon substrate by etching using the patterned resist as a mask member. An oxide film for an element separation region is formed, using the patterned first thin film as a mask.

20 Claims, 6 Drawing Sheets

METHOD OF MANUFACTURING SEMICONDUCTOR DEVICE WITH GETTERING AND ISOLATION

BACKGROUND OF THE INVENTION

1. Field of the Invention

The present invention relates to a method of manufacturing a semiconductor device, having an improved version of a step of forming a gettering layer which serves to prevent the deterioration of electrical characteristics of the device, which may be caused by metal impurity contamination.

2. Description of the Related Art

With regard to the manufacturing process of semiconductor devices, it is known that metals such as chromium, iron, copper, nickel and tungsten, which may be taken into a silicon substrate from materials of manufacturing apparatus, such as a diffusion furnace, chemicals for cleaning, and the like, induce a defect of crystal, which may cause a junction leak current or the like, thus deteriorating the characteristics of the semiconductor device.

The removal of these contamination metals, which is performed outside the active region of the semiconductor, is called "gettering". As one type of the gettering techniques, a so-called phosphorus gettering method is conventional employed. In this method, an active element such as MOSFET is formed on a silicon substrate, and thereafter the reverse surface of the silicon substrate is exposed, and a phosphorus diffusion is carried out at a high temperature (for example, 850° C. or higher). Thus, a high-concentration phosphorus diffusion layer is formed on the reverse surface of the silicon substrate, and metal components within the silicon substrate is caught in the high-concentration phosphorus diffusion layer.

This method is effective since it can be carried out at the same time as a reflow step, where a high-concentration phosphorus is diffused at a high temperature in an interlayer film formed on an obverse surface of a silicon substrate, and the obverse surface of the interlayer film is smoothed.

In the meantime, as the downsizing of semiconductor devices proceeds, it becomes necessary to form source and drain diffusion layers very thin in order to suppress the short channel effect of the MOSFET. As to the 0.25 $\mu$m-generation, for example, it is necessary to form a diffusion layer having a depth as shallow as about 0.08 $\mu$m. In order to achieve this, it is important that a high temperature heat process is not carried out after the formation of the source and drain diffusion layers.

Since the conventional phosphorus gettering method requires a high-temperature heat process for the diffusion of phosphorus, it becomes impossible to follow the downsizing of semiconductor devices. As a solution to this problem, there has been proposed a method of forming a high-concentration gettering layer at a low temperature. In this method, the gettering is carried out by a step of depositing a silicon thin film to which an impurity was added, on the reverse surface of a silicon substrate.

A conventional method of forming a MOSFET, which employs a process of depositing a silicon thin film to which an impurity was added, on the reverse surface of a silicon substrate, will now be described.

As can be seen in FIG. 1, a silicon oxide film having a thickness of about 50 nm is formed on an upper surface of a silicon substrate 301, a silicon thin film 303 having a thickness of about 100 nm is formed on the silicon oxide film 302, and a silicon nitride film 304 having a thickness of about 150 nm is formed on the silicon thin film 303, in the order.

After that, a resist is applied on the silicon nitride film 304 by a photolithographic method, and then a portion of the resist, which corresponds to an element separation region, is removed, thus forming a resist pattern 305 for the formation of the element separation region.

In general, the silicon oxide film 302 is formed by a thermal oxidizing method or a reduced pressure CVD method, and the silicon thin film 303 and the silicon nitride film 304 are formed by a reduced pressure CVD method. Consequently, these layers are deposited similarly on the reverse surface of the silicon substrate 301.

Next, as can be seen in FIG. 2, after the silicon nitride film 304 is etched by the RIE method using the silicon thin film 303 as an etching stopper, the resist pattern for forming the element separation region is stripped.

Next, as can be seen in FIG. 3, a silicon oxide film 306 having a thickness of about 700 nm is formed selectively in the element separation region by the thermal oxidizing method. This is a general method of forming an element separation, and it is called a LOCOS method.

Next, the silicon nitride film 304, the silicon thin film 303 and the silicon oxide film 302 formed on the obverse surface of the silicon substrate 301, and the silicon oxide film 302, the silicon thin film 303 and the silicon nitride film 304 formed on the rear side of the silicon substrate 301 are removed, and then a gate oxide film 307 is formed as can be seen in FIG. 4.

Next, steps of an ordinary MOSFET manufacturing process, that is, the formation of a gate electrode 308 and then source and drain diffusion layers 309, are carried out, thus forming a MOSFET on the silicon substrate 301. On the reverse surface of the silicon substrate 301, a silicon oxide film 310 and a silicon thin film 311 are formed.

Subsequently, as can be seen in FIG. 5, an interlayer insulation film 312 consisting mainly of a silicon oxide film, is deposited on the silicon substrate to have a thickness of about 900 nm, and then thus formed film is smoothed by, for example, a CMP (chemical mechanical polishing) method. After that, as shown in FIG. 6, the silicon oxide film 310 and the silicon thin film 311 deposited on the reverse surface of the silicon substrate 301 are selectively removed, thus exposing the reverse surface of the silicon substrate 301.

Then, as shown in FIG. 7, a silicon thin film 313 to which an impurity was added, is deposited over the interlayer insulation film 312 on the silicon substrate 301 to have a thickness of about 900 nm by the reduced pressure CVD method.

Subsequently, as shown in FIG. 8, only the silicon thin film 313 deposited over the interlayer insulation film 312 on the obverse surface of the silicon substrate 301 is selectively removed, whereas the silicon thin film 313 deposited on the reverse surface of the silicon substrate 301 is left as it is. The silicon thin film 313 to which the impurity was added, give rise to a gettering layer. The impurity added is generally boron or phosphorus.

After that, as can be seen in FIG. 9, a contact hole 314 which is made through the inter layer insulation film 312 and the gate oxide film 307 to reach the source and drain diffusion layers 309 is formed. Subsequently, a metal member 315 which communicates through the contact hole 314 is formed, thus completing a semiconductor device.

As described above, the conventional method of manufacturing a semiconductor device requires a step of depositing an interlayer insulation film 312 which is made of a silicon oxide film as a main component, followed by smoothing, and selectively removing the silicon oxide film 310 and the silicon thin film 311 deposited on the reverse surface of the silicon substrate, thus exposing the reverse surface of the silicon substrate 301, a step of depositing a silicon thin film 313 to which an impurity was added, on both sides of the silicon substrate 301, and a step of selectively removing only the silicon thin film 313 which is formed on the obverse surface of the silicon substrate 301. These steps are not necessary for forming a MOSFET solely, and thus the conventional method contains an increased number of steps and therefore an increased amount of manufacturing cost.

Conventionally, manufacturing methods which do not require an exclusive step for gettering are proposed in Jap. Pat. Appln. KOKAI Publications No. 61-159741, No. 2-218136, No. 5-109736 and the like. According to these methods, in a step of forming an insulation film on the obverse surface of a silicon substrate of the process of forming an ordinary MOSFET, an insulation film formed also on the reverse surface of a silicon substrate is removed so as to expose the reverse surface of the silicon substrate, and a polycrystal semiconductor film is formed on both sides of the silicon substrate. Then, an impurity is diffused into the polycrystal semiconductor films at a high temperature, and then the polycrystal semiconductor film formed on the obverse surface of the silicon substrate is selectively etched, thus forming a gate electrode.

In other words, the polycrystal semiconductor film formed on the obverse surface of the silicon substrate is selectively etched to be formed into a gate electrode, and the polycrystal semiconductor film formed on the reverse surface of the silicon substrate is brought into direct contact with the silicon substrate, thereby exhibiting a gettering effect.

With use of the above-described method, the exclusive step of gettering becomes unnecessary if only a step of removing the insulation film on the rear film of the silicon substrate in the stage of forming the gate electrode on the silicon substrate, is added.

However, in the conventional methods, it is required to carry out an impurity diffusion with respect to a polycrystal semiconductor film at a high temperature, and therefore these methods still cannot meet the trend of the downsizing of semiconductor devices.

Further, in order to suppress the short channel effect of the MOSFET, which occurs along with the downsizing of semiconductor devices, it is effective to use an N-type gate electrode in an N-channel MOS and a P-type gate electrode in a P-channel MOS. However, in the conventional method, the type of the gate electrode is limited to one due to the impurity diffusion step. Therefore, it has been pointed out that in order to form two types of gate electrodes, namely, N- and P-types, a separate step must be provided, which increases the number of steps.

SUMMARY OF THE INVENTION

The present invention has been proposed so as to solve the above-described drawbacks of the prior art technique, and the object thereof is to provide a method of manufacturing a semiconductor device, in which a silicon oxide film to which an impurity was added is deposited on the reverse surface of a silicon substrate, and thus a gettering layer is formed at a low temperature, while the number of manufacturing steps is reduced, thus preventing an increase in the manufacturing cost.

In order to achieve this object, there is provided, according to the present invention, a method of manufacturing a semiconductor devices, comprising the steps of:

forming a silicon oxide film on only an obverse surface of a silicon substrate during formation of an element separation region on a semiconductor substrate;

forming a silicon thin film on each of the silicon oxide film and a reverse surface of the silicon substrate, the silicon thin film formed on the reverse surface of the silicon substrate being effected by gettering.

There is further provided a method of manufacturing a semiconductor devices, comprising the steps of:

forming a silicon oxide film on an obverse surface and a reverse surface of a silicon substrate during formation of an element separation region on a semiconductor substrate;

exposing the reverse surface of the silicon substrate by selectively removing only the silicon oxide film formed on the reverse surface of the silicon substrate;

forming a silicon thin film on each of the silicon oxide film and the exposed reverse surface of the silicon substrate, the silicon thin film formed on the reverse surface of the silicon substrate being effected by gettering.

There is further provided a method of manufacturing a semiconductor device, comprising the steps of:

forming a silicon oxide film on an obverse surface and a reverse surface of a silicon substrate during formation of an element separation region on a semiconductor substrate;

exposing the reverse surface of the silicon substrate by selectively removing only the silicon oxide film formed on the reverse surface of the silicon substrate;

forming a silicon thin film on each of the silicon oxide film and the exposed reverse surface of the silicon substrate, the silicon thin film formed on the reverse surface of the silicon substrate being effected by gettering;

forming a first thin film on each of the silicon thin films;

patterning an element separation resist on the first thin film on the obverse surface of the silicon substrate;

patterning the first thin film on the obverse surface of the silicon substrate by etching using the patterned resist as a mask member; and forming an oxide film for an element separation region, using the patterned first thin film as a mask.

There is further provided a method of manufacturing a semiconductor device, comprising the steps of:

forming a silicon oxide film on an obverse surface and a reverse surface of a silicon substrate during formation of an element separation region on a semiconductor substrate;

exposing the reverse surface of the silicon substrate by selectively removing only the silicon oxide film formed on the reverse surface of the silicon substrate;

forming a silicon thin film on each of the silicon oxide film and the exposed reverse surface of the silicon substrate, the silicon thin film formed on the reverse surface of the silicon substrate being effected by gettering;

forming a first thin film on each of the silicon thin films;

patterning an element separation resist on the first thin film on the obverse surface of the silicon substrate;

patterning the first thin film on the obverse surface of the silicon substrate by etching using the patterned resist as a mask member; and forming an oxide film for an element separation region, using the patterned first thin film as a mask;

exposing sections other than the element separation region on the obverse surface of the silicon substrate by removing the first thin film, the silicon thin film and the silicon oxide film formed on the obverse surface of the silicon substrate;

forming a gate oxide film and a gate electrode on the exposed portion of the obverse surface of the silicon substrate, thereby forming a MOSFET; and forming an interlayer insulation film on the MOSFET.

With the above-described structure, it becomes possible in the method of manufacturing a semiconductor device, according to the present invention, to achieve the deposition of a silicon oxide film to which an impurity was added, on the reverse surface of a silicon substrate, and thus the formation of a gettering layer at a low temperature. Therefore, the number of manufacturing steps is reduced, thus preventing an increase in the manufacturing cost.

Further, it is also possible that after the above-described steps are through, a gate oxide film and a gate electrode are further formed on the exposed portion of the obverse surface of the silicon substrate, to make a MOSFET, and thus completing a MOSFET in which the silicon oxide film deposited on the exposed reverse surface of the silicon substrate, is rendered to serve as a gettering layer at a low temperature.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

The first embodiment of the method of manufacturing a semiconductor device according to the present invention, with reference to FIGS. 10 to 16.

Figure 1:
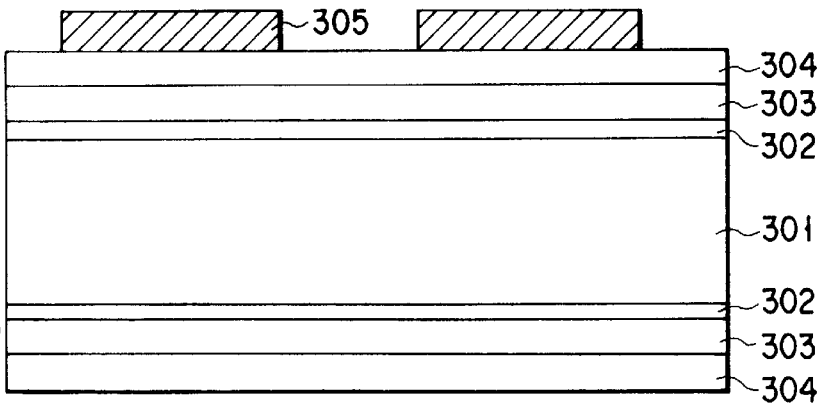
FIG. 1 is a cross sectional view of a part of a semiconductor device, which illustrates one step of a conventional method of manufacturing a semiconductor device.
Figure 2:
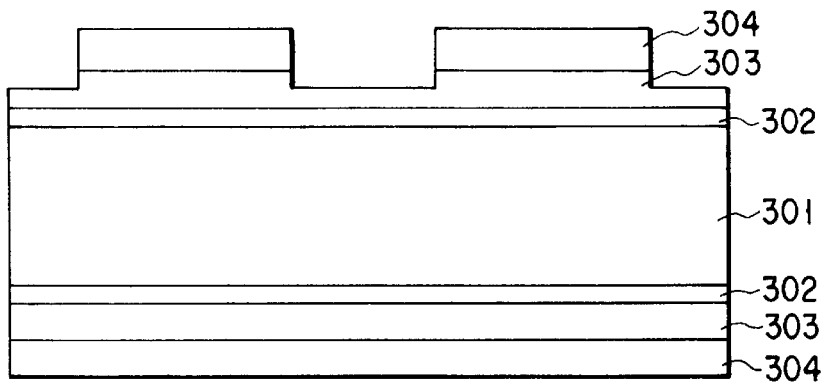
FIG. 2 is a cross sectional view of the part of the semiconductor device, which illustrates a subsequent step to that of FIG. 1.
Figure 3:
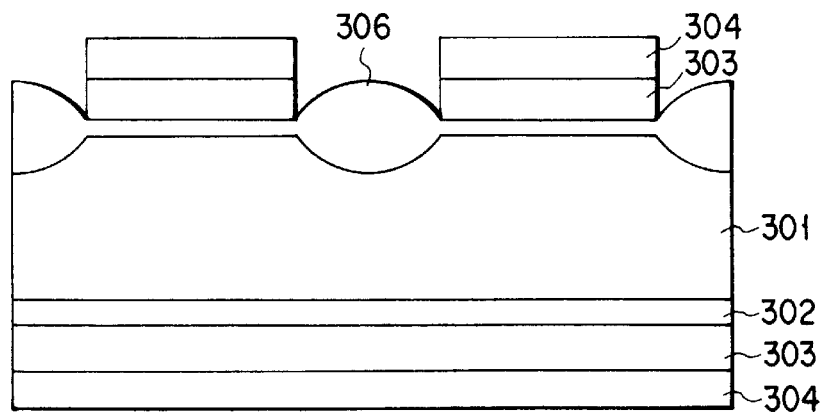
FIG. 3 is a cross sectional view of the part of the semiconductor device, which illustrates a subsequent step to that of FIG. 2.
Figure 4:
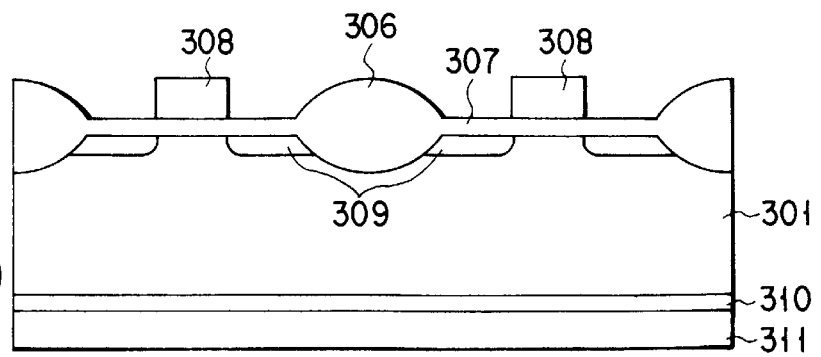
FIG. 4 is a cross sectional view of the part of the semiconductor device, which illustrates a subsequent step to that of FIG. 3.
Figure 5:
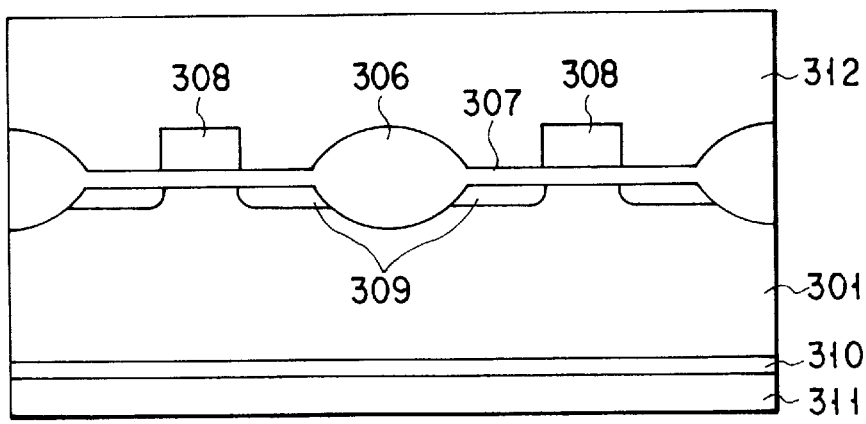
FIG. 5 is a cross sectional view of the part of the semiconductor device, which illustrates a subsequent step to that of FIG. 4.
Figure 6:
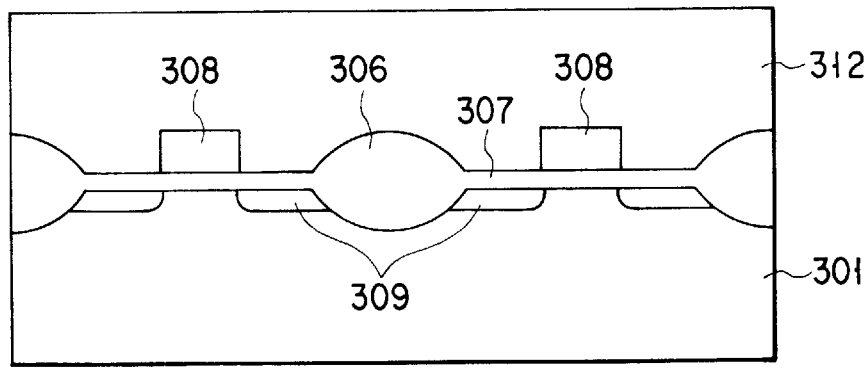
FIG. 6 is a cross sectional view of the part of the semiconductor device, which illustrates a subsequent step to that of FIG. 5.
Figure 7:
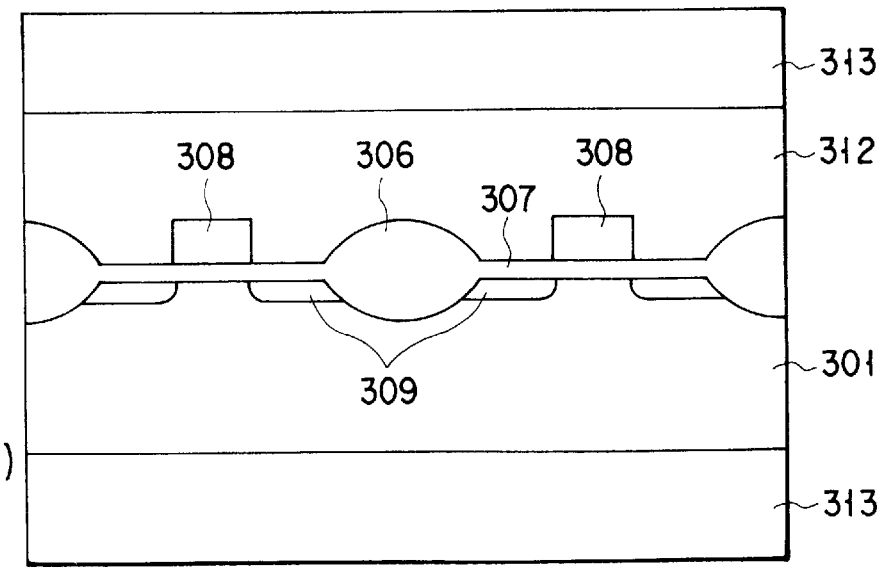
FIG. 7 is a cross sectional view of the part of the semiconductor device, which illustrates a subsequent step to that of FIG. 6.
Figure 8:
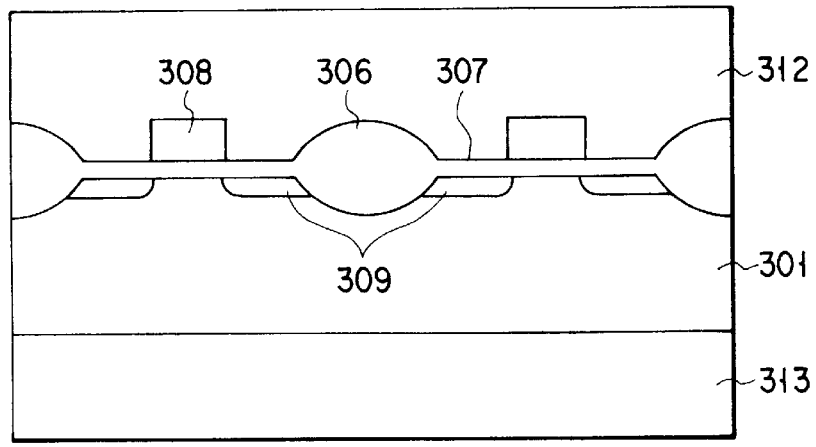
FIG. 8 is a cross sectional view of the part of the semiconductor device, which illustrates a subsequent step to that of FIG. 7.
Figure 9:
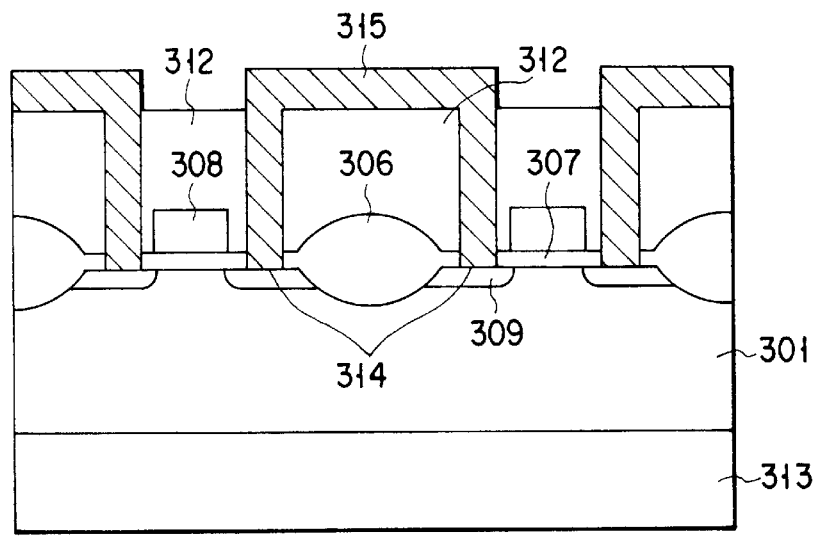
FIG. 9 is a cross sectional view of the part of the semiconductor device, which illustrates a subsequent step to that of FIG. 8.
Figure 10:
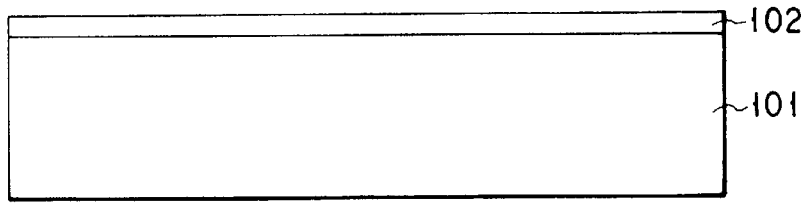
FIG. 10 is a cross sectional view of a part of a semiconductor device, which illustrates one step of a method of manufacturing a semiconductor device, according to the first embodiment of the present invention.

As shown in FIG. 10, a silicon oxide film 102 having a thickness of about 50 nm is formed on a silicon substrate 101 by a heat oxidizing method or a CVD method. In the case where the silicon oxide film 102 is formed also on the reverse surface of the silicon substrate 101 during the formation of the film on the obverse surface, only the silicon oxide film deposited on the reverse surface is selectively removed, and thus the reverse surface of the silicon substrate 101 is exposed.

Figure 11:
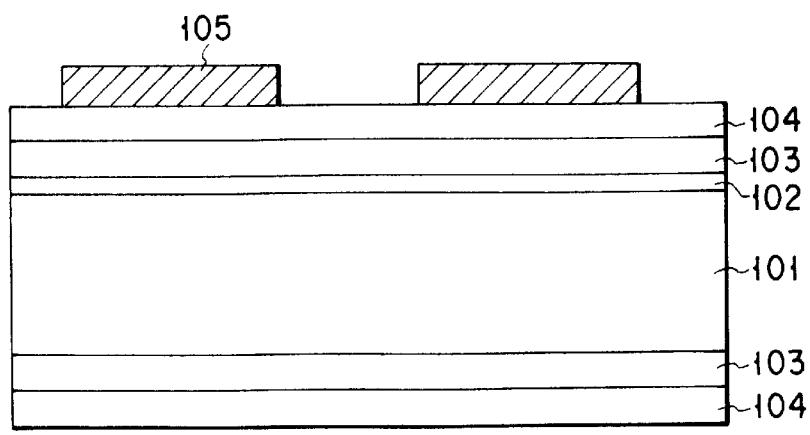
FIG. 11 is a cross sectional view of the part of the semiconductor device, which illustrates a subsequent step to that of FIG. 10.

Next, as shown in FIG. 11, a silicon thin film 103 to which an impurity was added, and having a thickness of about 100 nm, and a silicon nitride film 104 having a thickness of about 150 nm are deposited in the order on the silicon substrate 101.

Further, a resist is applied on the silicon nitride film 104 by the photolithographic method, and the portion of the resist, which corresponds to an element separation region, is removed, thus forming a resist pattern 105 used for forming an element separation region. The silicon thin film to which an impurity was added, and the silicon nitride film 104 are formed generally by a reduced pressure CVD method, and therefore these films are deposited on the reverse surface of the silicon substrate 101.

Further, the silicon thin film 103 to which the impurity was added, is formed in direct contact with the reverse surface of the silicon substrate 101, and this silicon thin film 103 exhibits the effect that it serves as a gettering layer.

Figure 12:
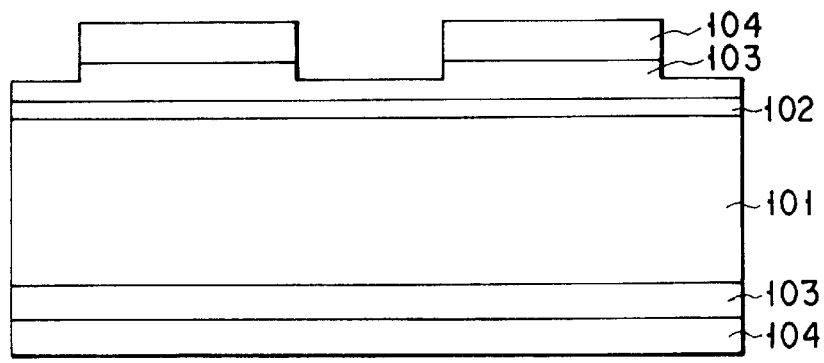
FIG. 12 is a cross sectional view of the part of the semiconductor device, which illustrates a subsequent step to that of FIG. 11.

Next, as shown in FIG. 12, after etching the silicon nitride film 104 by the RIE method, using the silicon thin film 103 as an etching stopper, the resist pattern 105 used for forming the element separation region is removed.

Figure 13:
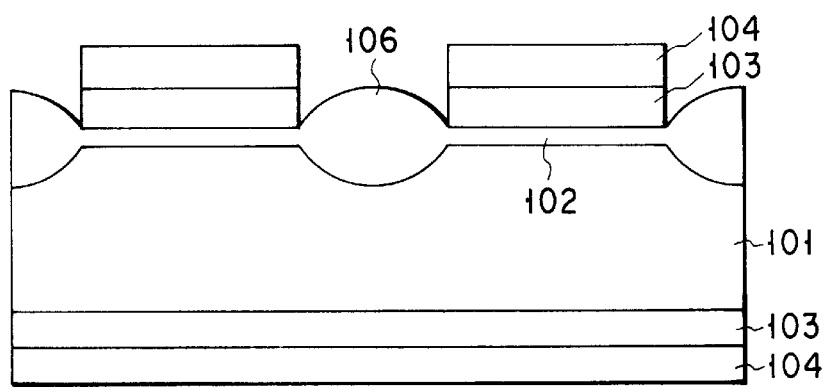
FIG. 13 is a cross sectional view of the part of the semiconductor device, which illustrates a subsequent step to that of FIG. 12.

Next, as shown in FIG. 13, a silicon oxide film 106 having a thickness of about 700 nm is formed selectively in the element separation region by the thermal oxidizing method. This method of forming an element separation region is called a LOCOS method.

Figure 14:
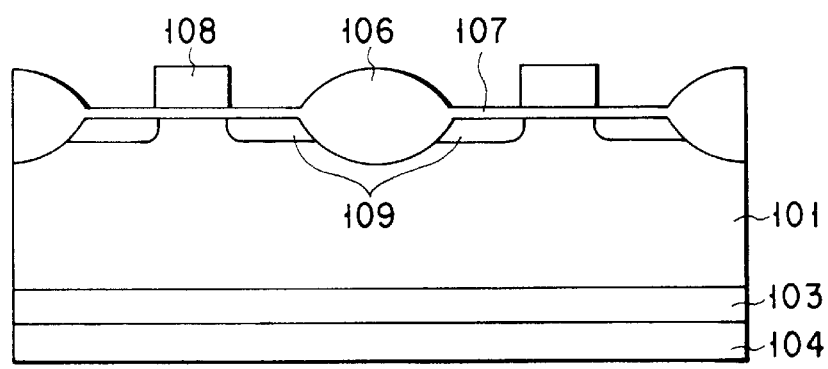
FIG. 14 is a cross sectional view of the part of the semiconductor device, which illustrates a subsequent step to that of FIG. 13.

Then, as shown in FIG. 14, the silicon nitride film 104, the silicon thin film 103 and the silicon oxide film 102 formed on the obverse surface side of the silicon substrate 101 are removed, and after that, steps of manufacturing an ordinary MOSFET, that is, the formation of a gate oxide film 107, a gate electrode 108 and source and drain diffusion layer 109, and the like, are carried out, thus forming a MOSFET on the silicon substrate 101.

In these ordinary steps of manufacturing a MOSFET, it is preferable that the silicon nitride film 104 formed on the reverse surface of the silicon substrate 101 should not be removed. The reason for this is that the silicon nitride film 104 serves as a cover and assist in rendering the silicon thin film 103 to which the impurity was added, remain as a gettering layer until the completion of the manufacturing process for the semiconductor device.

Figure 15:
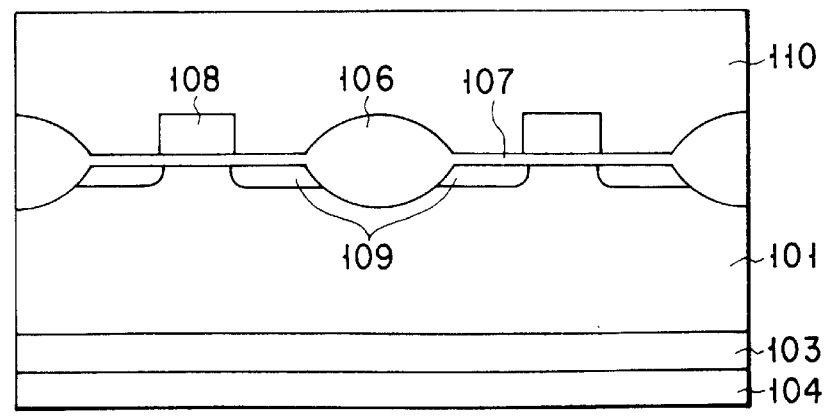
FIG. 15 is a cross sectional view of the part of the semiconductor device, which illustrates a subsequent step to that of FIG. 14.

Next, as can be seen in FIG. 15, an interlayer insulation film 110, which is made of a silicon oxide film as a main component, is deposited on the silicon substrate 101 to have a thickness of about 900 nm, and then smoothed by, for example, a CMP method.

Figure 16:
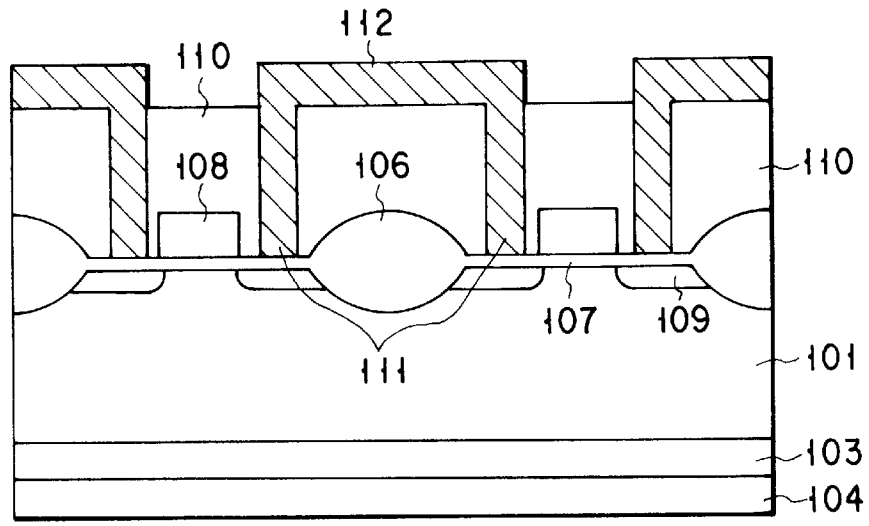
FIG. 16 is a cross sectional view of the part of the semiconductor device, which illustrates a subsequent step to that of FIG. 15.

After that, as shown in FIG. 16, a contact hole 111 is formed, and the contact hole 111 is filled with a metal 112, thus communicating through the contact hole 111 via the metal 112.

Through the above-described steps, a semiconductor device is completed by the method according to the first embodiment of the present invention.

In the method of manufacturing a semiconductor device, according to the first embodiment of the present invention, the step of depositing an impurity-added silicon thin film which serves as a gettering layer, and the step of depositing a silicon thin film used as an etching stopper in the formation of the element separation region by a so-called LOCOS method, are carried out in the same step. Therefore, in the present invention, it is not necessary to provide a step of depositing an interlayer insulation film, which is made of a silicon oxide film as a main component, followed by smoothing, and selectively removing the silicon oxide film, the silicon thin film and the interlayer insulation film deposited on the reverse surface of the silicon substrate, thus exposing the reverse surface of the silicon substrate, a step of depositing a silicon thin film to which an impurity was added, on both sides of a silicon substrate, and a step of selectively removing only the silicon thin film which is formed on the obverse surface of the silicon substrate. Further, in the present invention, a silicon thin film to which an impurity was added is formed on the reverse surface of a silicon substrate, and therefore it is not necessary to provide a step of diffusing an impurity at a high temperature. Consequently, the silicon thin film to which an impurity was added is formed at a low temperature as a gettering layer on the reverse surface of the silicon substrate, and the number of manufacturing steps can be reduced, thus making it possible to reduce the manufacturing cost.

In the above-described first embodiment, the LOCOS method is used to form the element separation region; however the method of forming the element separation region is arbitrary as long as it is a process where a silicon thin film is used in its element separation step.

A method according to the second embodiment of the present invention, in which an element separation region is formed by use of an STI method illustrated in FIGS. 17 to 20, will now be described.

Figure 17:
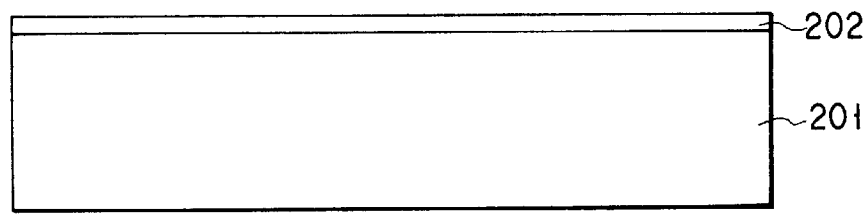
FIG. 17 is a cross sectional view of a part of a semiconductor device, which illustrates one step of a method of manufacturing a semiconductor device, according to the second embodiment of the present invention.

As shown in FIG. 17, a silicon oxide film 202 having a thickness of about 50 nm is formed on a silicon substrate 201 by a heat oxidizing method or a CVD method. In the case where the silicon oxide film 202 is formed also on the reverse surface of the silicon substrate 201 during the formation of the film on the obverse surface, only the silicon oxide film 202 deposited on the reverse surface is selectively removed, and thus the reverse surface of the silicon substrate 201 is exposed.

Figure 18:
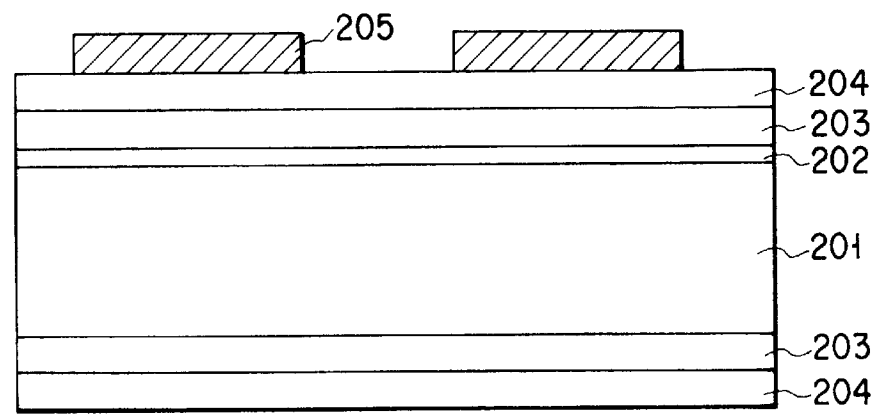
FIG. 18 is a cross sectional view of the part of the semiconductor device, which illustrates a subsequent step to that of FIG. 17.

Next, as shown in FIG. 18, a silicon thin film 203 to which an impurity was added, and having a thickness of about 300 nm, and a silicon oxide film 204 having a thickness of about 200 nm are deposited in the order on the silicon substrate 101.

Further, a resist is applied on the silicon oxide film 204 by the photolithographic method, and the portion of the resist, which corresponds to an element separation region, is removed, thus forming a resist pattern 205 used for forming an element separation region.

The silicon thin film 203 to which an impurity was added, and the silicon oxide film 204 are formed generally by a reduced pressure CVD method, and therefore these films are deposited on the reverse surface of the silicon substrate 201. Further, the silicon thin film 203 to which the impurity was added, is formed in direct contact with the reverse surface of the silicon substrate 201, and this silicon thin film 103 exhibits a significant as a gettering layer.

Figure 19:
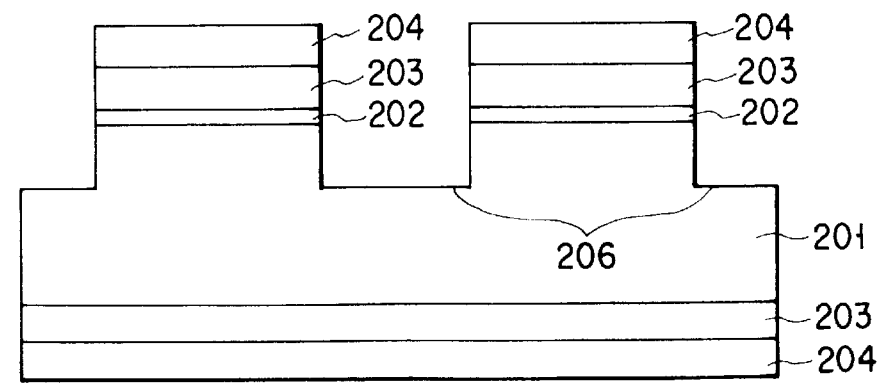
FIG. 19 is a cross sectional view of the part of the semiconductor device, which illustrates a subsequent step to that of FIG. 18.

Next, as can be seen in FIG. 19, the silicon oxide film 204, the silicon thin film 203 to which the impurity was added, and the silicon oxide film 202 are etched. Further, after removing the resist pattern 205 used for forming an element separation region, the silicon substrate 201 is etched using a silicon oxide film 204 as a mask, so as to form a trench 206 having a depth of about 700 nm and serving as an element separation region.

Figure 20:
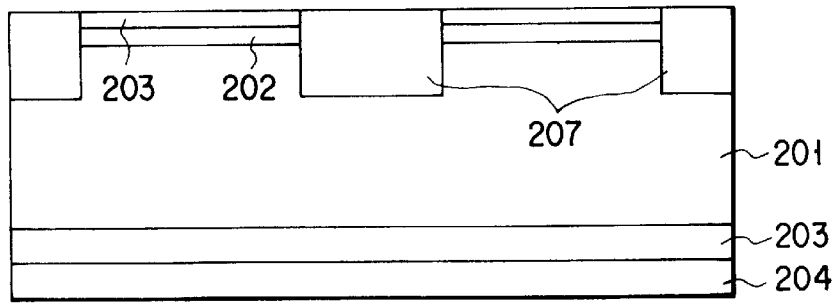
FIG. 20 is a cross sectional view of the part of the semiconductor device, which illustrates a subsequent step to that of FIG. 19.

Then, as shown in FIG. 20, a silicon oxide film 207 having a thickness of about 1000 nm is deposited on the obverse surface of the silicon substrate 201 by a plasma CVD method. Further, the silicon oxide film 207 is smoothed by, for example, the CMP method, using the silicon thin film 203 to which the impurity was added, as an etching stopper, so as to bury the silicon oxide film 207 in the trench 206 which will serve as the element separation region. This method of forming an element separation region is called an STI method.

Figure 21:
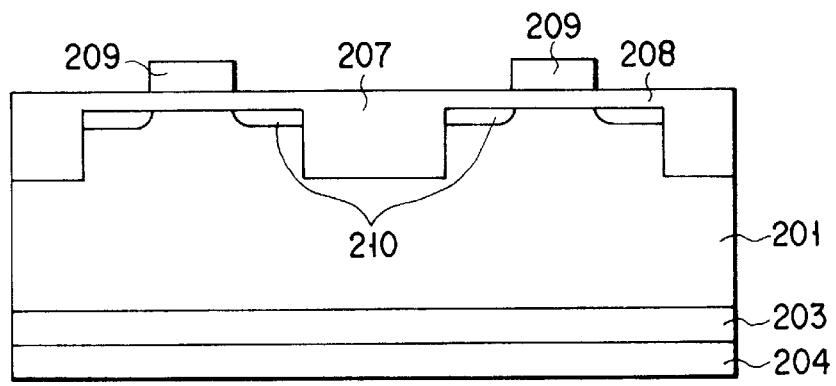
FIG. 21 is a cross sectional view of the part of the semiconductor device, which illustrates a subsequent step to that of FIG. 20.

Next, as shown in FIG. 21, the silicon thin film 203 to which the impurity was added, and the silicon oxide film 202 formed on the obverse surface of the silicon substrate 201 are removed, and after that, steps of manufacturing an ordinary MOSFET, that is, the formation of a gate oxide film 208, a gate electrode 209 and source and drain diffusion layer 210, and the like, are carried out, thus forming a MOSFET on the silicon substrate 201.

Figure 22:
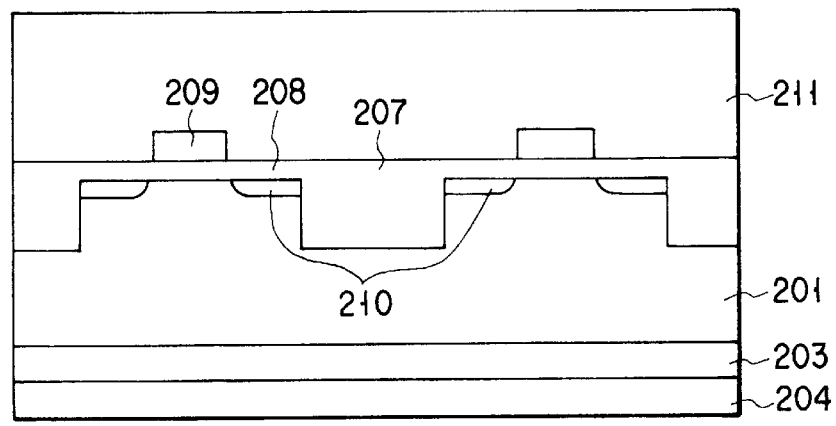
FIG. 22 is a cross sectional view of the part of the semiconductor device, which illustrates a subsequent step to that of FIG. 21.

Next, as can be seen in FIG. 22, an interlayer insulation film 211 consisting mainly of a silicon oxide film is deposited on the silicon substrate 201 to have a thickness of about 900 nm, and then smoothed by, for example, a CMP method.

Figure 23:
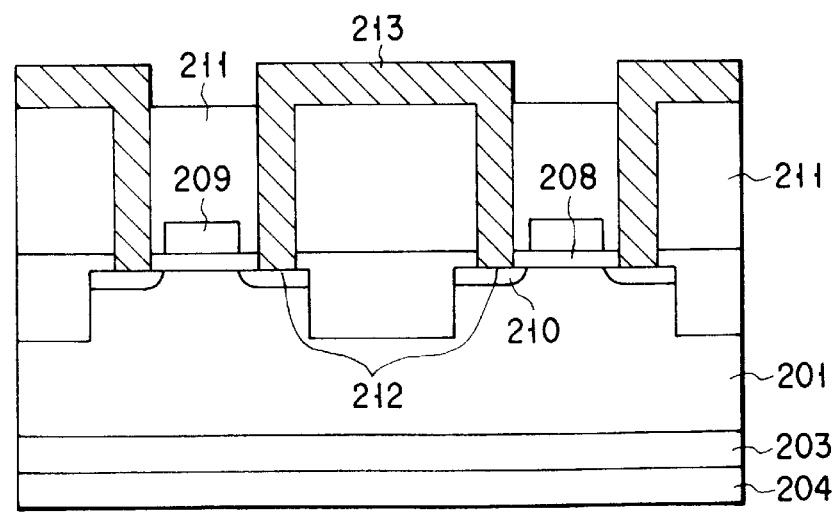
FIG. 23 is a cross sectional view of the part of the semiconductor device, which illustrates a subsequent step to that of FIG. 22.

After that, as shown in FIG. 23, a contact hole 212 is formed, and the contact hole 212 is filled with a metal 213, thus communicating through the contact hole 212 via the metal 213.

Through the above-described steps, a semiconductor device is completed by the method according to the second embodiment of the present invention.

In the method of manufacturing a semiconductor device, according to the second embodiment of the present invention, the step of depositing a silicon thin film which serves as a gettering layer, and the step of depositing a silicon thin film used as an etching stopper in the formation of the element separation region by a so-called STI method, are carried out in the same step. Therefore, as in the first embodiment, in the case where the STI method is used, an exclusive step of forming a gettering layer becomes unnecessary. Consequently, the number of manufacturing steps can be reduced, and the manufacturing cost can be reduced.

Further, even in the case where an N-type gate electrode is used in an N-channel MOS and a P-type gate electrode is used in a P-channel MOS in order to suppress the short channel effect of the MOSFET, which is caused by the downsizing of the semiconductor device, a gettering layer is formed during the formation of the element separation region. This gettering layer does not require a step of thermally diffusing an impurity thereinto, and therefore it becomes possible to form two types, P- and N-types, of gate electrodes on the same substrate.

In the first and second embodiments, the present invention is explained in connection with the cases where the invention is applied in the process of manufacturing a MOSFET. However, the invention is not limited to these embodiments, and it can be applied to any methods of manufacturing a semiconductor element, as long as the methods include a step of forming an element separation region.

Further, in the first and second embodiments, a silicon thin film to which an impurity was added, was used as a gettering layer; however a silicon thin film to which no impurity was added can be used to exhibit a gettering effect at a low temperature. In this case, the gettering effect is lower than the case of the silicon thin film to which the impurity was added.

Typical examples of the impurity added to the silicon thin film are boron and phosphorus; however as long as it is able to obtain a gettering effect, the type of the additive is arbitrary.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:

forming a silicon oxide film only on a first major surface of a silicon substrate;

Forming a silicon film on each of said silicon oxide film and a second major surface on an exposed opposite side of said silicon substrate, before formation of an element separation region, said silicon film formed on said second major surface of said silicon substrate performing a gettering function during subsequent processing steps;

forming a second film on said silicon film over said first major surface of said silicon substrate;

patterning an element separation resist to define said element separation region on said second film; and patterning said second film by etching using said patterned resist to define an element separation mask.

2. A method of manufacturing a semiconductor device according to claim 1, wherein an impurity is added to said silicon film formed on said second major surface of said silicon substrate.

3. A method of manufacturing a semiconductor device according to claim 1, wherein said silicon film is one selected from a group consisting of a silicon oxide film, a silicon nitride film, a silicide film and silicon.

4. A method of manufacturing a semiconductor device according to claim 1, wherein the step of forming a silicon oxide film only on said first major surface comprises the steps of:

forming a silicon oxide film on said first major surface and said second major surface of said silicon substrate; and exposing said second major surface of said silicon substrate by selectively removing only said silicon oxide film formed on said second major surface of said silicon substrate, wherein said silicon film is formed on said second major surface of said silicon substrate exposed in said step of exposing the second major surface.

5. A method of manufacturing a semiconductor device according to claim 4, wherein an impurity is added to said silicon film formed on said second major surface of said silicon substrate.

6. A method of manufacturing a semiconductor device according to claim 5, wherein said silicon film is one selected from a group consisting of a silicon oxide film, a silicon nitride film, a silicide film and silicon.

7. A method of manufacturing a semiconductor device according to claim 1, further comprising the steps of:

removing portions of said silicon film from over said first major surface of said silicon substrate to provide a pattern of exposed portions of said first major surface of said silicon substrate; and forming an array of element separation regions extending from said first major surface into said silicon substrate.

8. A method of manufacturing a semiconductor device according to claim 7, wherein an impurity is added to said silicon film formed on said second major surface of said silicon substrate.

9. A method of manufacturing a semiconductor device according to claim 7, wherein said silicon film is one selected from a group consisting of a silicon oxide film, a silicon nitride film, a silicide film and silicon.

10. A method of manufacturing a semiconductor device according to claim 7, wherein remaining portions of said silicon film are created by said step of removing portions of said silicon film, and wherein said remaining portions become a part of said element separation mask used in said step of forming an array of element separation regions.

11. A method of manufacturing a semiconductor device according to claim 10, wherein said element separation mask further comprises said patterned resist.

12. A method of manufacturing a semiconductor device according to claim 10, wherein said element separation mask is used to protect portions of said first major surface during a thermal oxidation process used to form said element separation region by a LOCOS method.

13. A method of manufacturing a semiconductor device according to claim 12, wherein said silicon film is formed before said thermal oxidation process.

14. A method of manufacturing a semiconductor device according to claim 10, wherein said element separation mask exposes portions of said first major surface removed by etching to define one or more trenches that are filled to form element separation regions.

15. A method of manufacturing a semiconductor device according to claim 1, wherein said element separation mask is used to protect portions of said first major surface during a thermal oxidation process used to form element separation regions according to a LOCOS method.

16. A method of manufacturing a semiconductor device according to claim 15, wherein said silicon film is formed before said thermal oxidation process.

17. A method of manufacturing a semiconductor device according to claim 1, wherein said element separation mask exposes portions of said first major surface removed by etching to define one or more trenches that are filled to form element separation regions.

18. A method of manufacturing a semiconductor device according to claim 1, further comprising the step of forming element separation regions within openings in said element separation mask.

19. A method of manufacturing a semiconductor device according to claim 18, further comprising the steps of:
    removing said element separation mask to provide exposed portions of said first major surface of said silicon substrate;
    forming a gate oxide film and a gate electrode on said exposed portions of said first major surface of said silicon substrate;
    forming a MOSFET including said gate electrode; and
    forming an interlayer insulating film on said MOSFET.

20. A method of manufacturing a semiconductor device according to claim 19, wherein an impurity is added to said silicon film formed on said second major surface of said silicon substrate.

* * * * *